(12) United States Patent
Maeto (10) Patent No.: US 9,118,348 B2
(45) Date of Patent: Aug. 25, 2015

(54) DECODING APPARATUS, STORAGE APPARATUS, AND DECODING METHOD

(71) Applicant: Kabushiki Kaisha Toshiba, Minato-ku, Tokyo (JP)

(72) Inventor: Nobuhiro Maeto, Yokohama (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 310 days.

(21) Appl. No.: 13/738,749

(22) Filed: Jan. 10, 2013

(65) Prior Publication Data

US 2014/0032996 A1    Jan. 30, 2014

(30) Foreign Application Priority Data

Jul. 25, 2012   (JP) ................. 2012-165217

(51) Int. Cl.
| | |
|---|---|
| *H03M 13/03* | (2006.01) |
| *H03M 13/00* | (2006.01) |
| *H03M 13/13* | (2006.01) |
| *H03M 13/25* | (2006.01) |
| *H03M 13/11* | (2006.01) |
| *H03M 13/41* | (2006.01) |

(52) U.S. Cl.
CPC .......... *H03M 13/13* (2013.01); *H03M 13/1111* (2013.01); *H03M 13/255* (2013.01); *H03M 13/6331* (2013.01); *H03M 13/658* (2013.01); *H03M 13/6583* (2013.01); *H03M 13/6591* (2013.01); *H03M 13/4138* (2013.01)

(58) Field of Classification Search
CPC .......... H03M 13/1111; H03M 13/116; H03M 13/4138; H03M 13/1154; H03M 13/225; H04L 25/067; G11B 2020/185
USPC ......... 714/758, 794, 795, 780, 786, 752, 753; 375/262, 341
See application file for complete search history.

(56) References Cited

U.S. PATENT DOCUMENTS

| | | | |
|---|---|---|---|
| 6,757,117 B1 * | 6/2004 | Livingston | 360/25 |
| 7,836,373 B2 * | 11/2010 | Lim et al. | 714/751 |
| 8,015,499 B2 | 9/2011 | Kanaoka | |
| 8,250,437 B2 | 8/2012 | Sakurada et al. | |
| 8,321,772 B1 * | 11/2012 | Yeung et al. | 714/795 |
| 2008/0040651 A1 * | 2/2008 | Kanaoka et al. | 714/794 |
| 2008/0104486 A1 | 5/2008 | Kanaoka | |
| 2011/0083060 A1 | 4/2011 | Sakurada et al. | |

FOREIGN PATENT DOCUMENTS

| | | |
|---|---|---|
| JM | 2011-081858 A | 4/2011 |
| JP | 4652310 B2 | 3/2011 |
| JP | 2011-087117 A | 4/2011 |

* cited by examiner

*Primary Examiner* — Christine Tu
(74) *Attorney, Agent, or Firm* — Knobbe, Martens, Olson & Bear LLP (57) ABSTRACT

According to at least one embodiment, a decoding apparatus includes an error correcting module and a change module. The error correcting module decodes for correcting error of encoded data using a low-density party check code and likelihood information. The change module changes a value of the likelihood information if the value of the likelihood information is continuously smaller than a predetermined value.

20 Claims, 7 Drawing Sheets

DECODING APPARATUS, STORAGE APPARATUS, AND DECODING METHOD

CROSS-REFERENCE TO RELATED APPLICATIONS

This application is based upon and claims the benefit of priority from Japanese Patent Application No. 2012-165217, filed Jul. 25, 2012, the entire contents of which are incorporated herein by reference.

FIELD

Embodiments described herein relate generally to a decoding apparatus, storage apparatus, and decoding method, which allow error correcting decoding of encoded data.

BACKGROUND

In recent years, various error correcting techniques for correcting errors of encoded data upon decoding the encoded data have been developed. Also, an error correcting technique having higher error correcting performance is demanded.

The error correcting technique having the high error correcting performance includes, for example, the error correcting technique using LDPC (Low Density Parity Check) codes and the like. An LDPC decoder which performs an LDPC decoding upon correcting errors using the LDPC codes is normally used in combination with an SOVA (Soft Output Viterbi Algorithm) decoder based on a soft decision Viterbi algorithm. Likelihood of soft decision results output from the SOVA decoder are used as error correcting information.

However, even if the encoded data is decoded using the LDPC decoder and the SOVA decoder, if the likelihood lower, the error correcting decoding performance lowers.

Also, it is demanded to enhance the error correcting performance by improving the decoding characteristics of the LDPC decoder in place of development of a new algorithm associated with the error correcting decoding.

DETAILED DESCRIPTION

In general, according to one embodiment, a decoding apparatus includes an error correcting module and a change module. The error correcting module decodes for correcting error of encoded data using a low-density party check code and likelihood information. The change module changes a value of the likelihood information if the value of the likelihood information is continuously smaller than a predetermined value.

An embodiment according to the decoding apparatus will be described hereinafter with reference to the drawings. The embodiment according to the decoding apparatus is applicable to various apparatuses, but in the first embodiment, it will be explained about the example of the magnetic disk apparatus. Other examples of the decoding apparatus include a receiving apparatus, playback apparatus, and the like.

Figure 1:
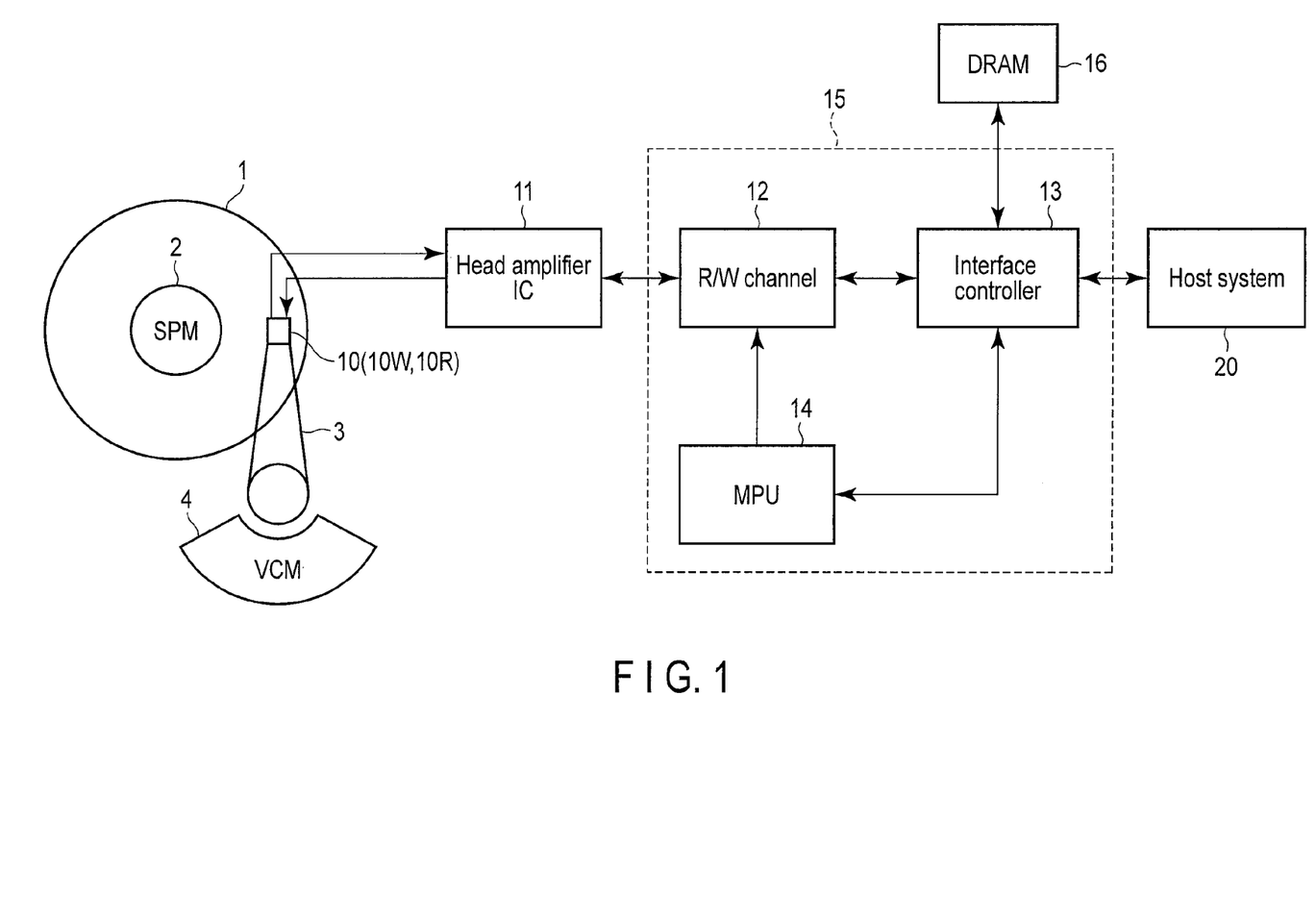
FIG. 1 is an exemplary block diagram showing an example of the configuration of a magnetic disk apparatus according to an embodiment.

FIG. 1 is a block diagram showing principal part of the magnetic disk apparatus according to this embodiment.

As shown in FIG. 1, the magnetic disk apparatus roughly includes a head-disk assembly (HDA), a head amplifier integrated circuit (to be referred to as a head amplifier IC hereinafter) 11, and a hard disk controller (HDC) 15.

The HDA includes a magnetic disk 1 as a recording medium, a spindle motor (SPM) 2, an arm 3 which mounts a head 10, and a voice coil motor (VCM) 4. The magnetic disk 1 is rotated by the spindle motor 2. The arm 3 and VCM 4 configure an actuator. The actuator can control to move the head 10 mounted on the arm 3 to a designated position on the magnetic disk 1 upon driving the VCM 4.

The head 10 has a write head 10W and read head 10R, which are mounted on a slider as a main body of the head 10. The read head 10R reads out data recorded in data tracks on the magnetic disk 1. The write head 10W writes data on the magnetic disk 1.

The head amplifier IC 11 has a pre-amplifier and write driver. The pre-amplifier amplifies a read signal read out by the read head 10R, and transfers the amplified read signal to a read/write (R/W) channel 12. On the other hand, the write driver transfers, to the write head 10W, a write current according to write data output from the R/W channel 12.

The HDC 15 is configured by a 1-chip integrated circuit including the R/W channel 12, an interface controller 13, and a microprocessor (MPU) 14. The R/W channel 12 includes a read channel used to execute signal processing of read data, and a write channel used to execute signal processing of the write data.

The interface controller 13 controls data transfer between a host system 20 and the R/W channel 12.

The MPU 14 is a main controller of the magnetic disk apparatus. The MPU 14 executes servo-control to perform positioning of the head 10 by controlling the VCM 4. Also, the MPU 14 instructs to execute a likelihood operation and the like to be described in detail later.

Prior to a description of the detailed configuration of this embodiment, an overview in case that needs to perform the likelihood operation in this embodiment will be described with reference to FIGS. 2, 3, 4, 5, 6, and 7.

The LDPC code will be described first with reference to FIG. 2.

The LDPC code is used to perform the LDPC decoding to encoded data 23. More specifically, whether or not the encoded data 23 includes errors can be checked using the LDPC code.

Figure 2:
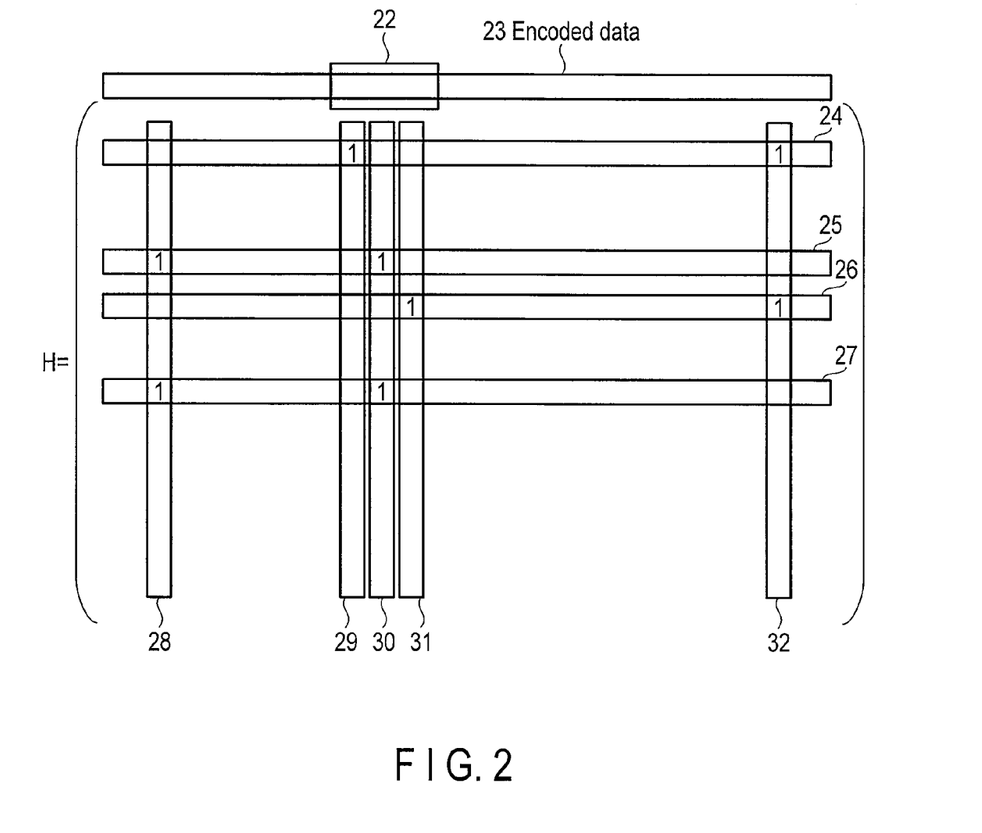
FIG. 2 is an exemplary view showing an overview of an LDPC code used in an LDPC decoding of an LDPC decoder in the magnetic disk apparatus according to the embodiment.

The LDPC code can be defined by a parity check matrix H shown in FIG. 2. The parity check matrix H is a sparse parity-check matrix including randomly selected check bits. A check bit is expressed by "0" or "1" as a value of each element of the parity check matrix H. Also, the sparse parity-check matrix is a parity-check matrix including many check bits expressed by "0" and scarce check bits expressed by "1".

According to a plurality of rows and a plurality of columns in the parity check matrix H, the rows and the columns including check bits "1" are respectively columns 28, 29, 30, 31, and 32 in turn from the left column of the parity check matrix H, and rows 24, 25, 26, and 27 in turn from the upper row of the parity check matrix H. The encoded data 23 is data having the number of bits corresponding to the number of columns of the parity check matrix H, as shown in FIG. 2. A region 22 includes neighboring bit sequences of the encoded data 23 corresponding to the columns 29, 30, and 31. Note that the columns 29, 30, and 31 respectively satisfy parity check equations.

Figure 3:
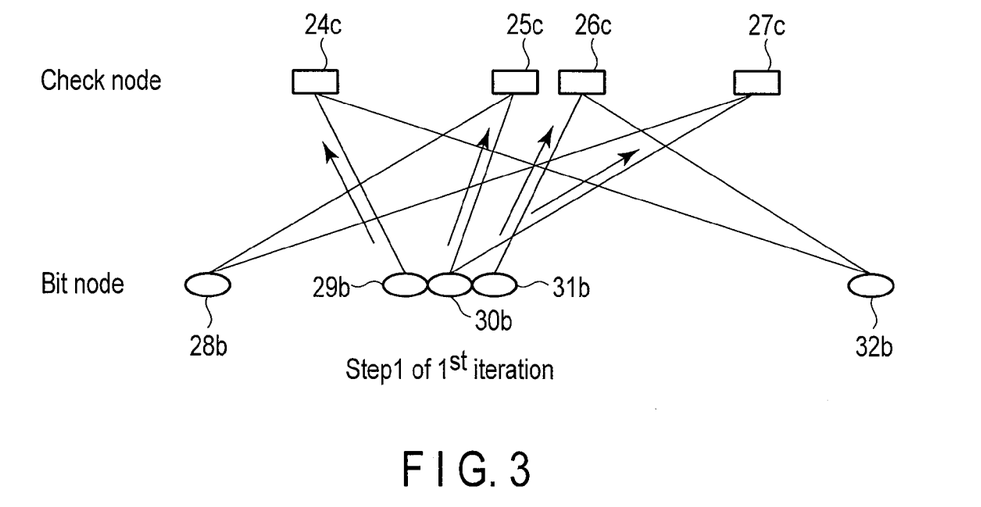
FIG. 3 is an exemplary view showing an example of belief propagation of the LDPC decoding of the LDPC decoder in the magnetic disk apparatus according to the embodiment.

FIG. 3 shows an example of a tanner graph corresponding to the parity check matrix H. The tanner graph is a graph from which the characteristics of a decoder such as the LDPC decoder, the configuration of the LDPC code used by the decoder, performance analysis of the decoder, and the like can be revealed. The tanner graph corresponding to the parity check matrix H includes two types of nodes called bit nodes and check nodes. Each of the bit nodes expresses a code bit symbol corresponding to one bit included in the encoded data 23. The check nodes correspond to parity check equations as parity restraint conditions between bit symbols.

FIG. 3 shows Step 1 of iteration of the LDPC decoding as one of iterative decoding for performing iterative decoding. Arrows in FIG. 3 indicate directions of the belief propagation of Step 1 in the iterative decoding. Bit nodes $28b$, $29b$, $30b$, $31b$, and $32b$ respectively correspond to the columns 28, 29, 30, 31, and 32 in FIG. 2. Check nodes $24c$, $25c$, $26c$, and $27c$ respectively correspond to the rows 24, 25, 26, and 27 in FIG. 2.

The belief propagation is performed between a check node and bit node corresponding to a row and column including a check bit "1". For example, a check bit of a matrix element indicated by the column 28 and the row 25 and a check bit of a matrix element indicated by the column 28 and the row 27 are "1". Therefore, the belief propagation is made between the bit node $28b$ and check node $25c$ and the belief propagation is made between the bit node $28b$ and check node $27c$. Note that in FIG. 3, the bit nodes and the check nodes between which the belief propagation is made are coupled by the solid lines. Likewise, the belief propagation is made between the bit node $30b$ and the check node $25c$. For this reason, the bit nodes $28b$ and $30b$ mutually exert influences of the belief propagation between the bit nodes $28b$ and $30b$ via the check node $25c$.

In the LDPC decoding, the belief propagation is mutually made between non-neighboring bits of the encoded data 23. However, the belief propagation is not mutually made between neighboring bits of the encoded data 23. For example, the region 22 including neighboring bits includes three continuous bits, and these three bits respectively correspond to the bit nodes $29b$, $30b$, and $31b$. The bit node $29b$ makes the belief propagation with the check node $24c$, the bit node $30b$ makes the belief propagation with the check nodes $25c$ and $27c$, and the bit node $31b$ makes the belief propagation with the check node $26c$. Therefore, the bit nodes $29b$, $30b$, and $31b$ respectively make the belief propagation with different check nodes. Therefore, the belief propagation is not made between the neighboring bits.

Figure 4:
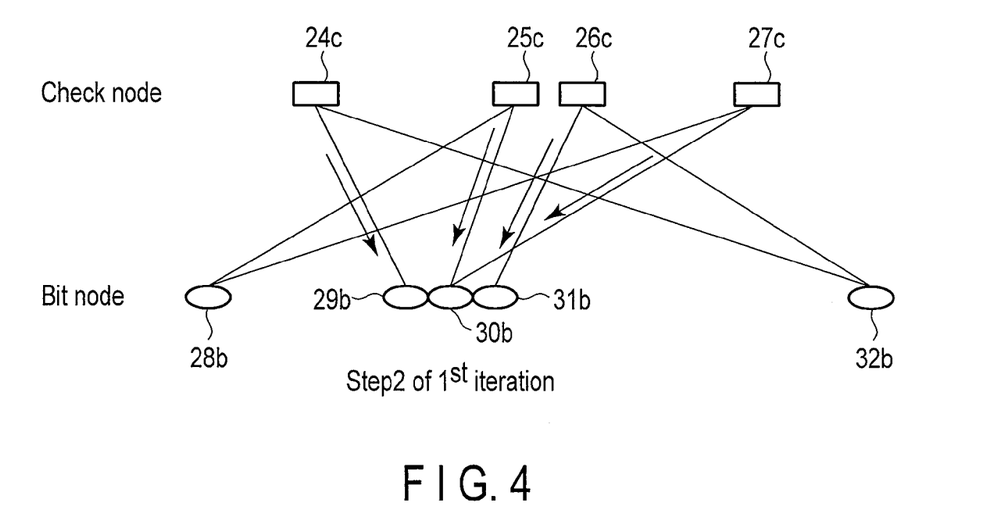
FIG. 4 is an exemplary view showing another example of the belief propagation of the LDPC decoding of the LDPC decoder in the magnetic disk apparatus according to the embodiment.

FIG. 4 shows another example of the tanner graph corresponding to the parity check matrix H. Also, FIG. 4 shows Step 2 of iteration of the LDPC decoding as one of iterative decoding for performing iterative decoding. In Step 2, the belief propagation is made from the check nodes to the bit nodes, as indicated by arrows in FIG. 4.

As described above with reference to FIGS. 3 and 4, belief propagation as a result of iterative decoding does not occur between neighboring bit symbols due to the low-density property of the LDPC code so as to maintain randomness required to guarantee maximum-likelihood decoding characteristics of the LDPC code.

Figure 5:
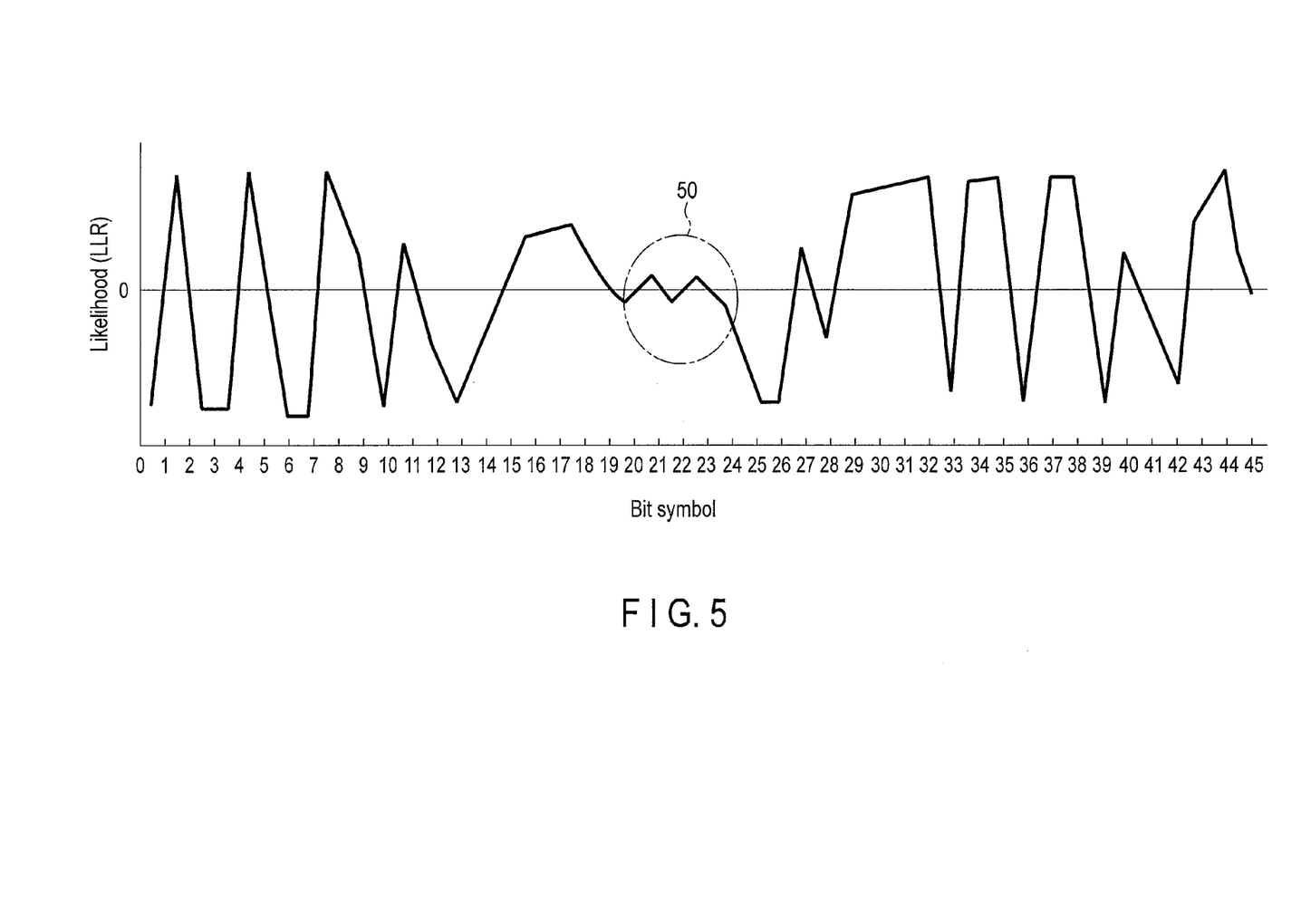
FIG. 5 is an exemplary graph showing a likelihood information distribution used in the LDPC decoding of the LDPC decoder in the magnetic disk apparatus according to the embodiment.

FIG. 5 is a distribution graph of pieces of likelihood information indicating the performance of the LDPC decoding using the LDPC code. The likelihood information in this case is information associated with a likelihood of a soft decision result output from the SOVA decoder before execution of the LDPC decoding. Note that the SOVA decoder will be described later with reference to FIG. 8. Since the LDPC decoding performs error correcting decoding based on this likelihood information, if the likelihood information lowers, the LDPC decoding performance lowers.

The abscissa of FIG. 5 represents each of bits included in the encoded data 23. The ordinate of FIG. 5 represents an LLR (Log-Likelihood-Ratio) as the likelihood information. The likelihood information is obtained for each bit. FIG. 5 is a graph obtained by plotting LLR values obtained for respective bits. As shown in FIG. 5, pieces of likelihood information of respective bits have variations. Also, as for some neighboring bits, signs (polarities) of LLR values are inverted. As for the polarities, for example, if a polarity is positive, the LDPC decoding result is "1". If a polarity is negative, the LDPC decoding result is "0". Furthermore, absolute values of LLR values of respective bits also have variations. In this way, the LLR values are not constant for respective bits.

As shown in FIG. 5, some bits (to be referred to as continuous low-likelihood bits hereinafter) in a region 50 indicate LLR values close to zero, and the polarities of the LLR values are continuously inverted. Pieces of likelihood information corresponding to such continuous low-likelihood bits will be referred to as a low likelihood information interval hereinafter. This low likelihood information interval may often lower the LDPC decoding performance. More specifically, in case that the LDPC decoding is executed using low likelihood information, many errors occur in the LDPC decoding result. If the polarities are continuously inverted, for example, wrong data "0" are continuously obtained for bits corresponding to correct data "1". Note that the LDPC decoding performance is defined by error correcting performance, an SER (Sector Error Rate), and the like of the LDPC decoding. In this embodiment, the LDPC decoding performance is improved by operating pieces of likelihood information of the continuous low-likelihood bits. More specifically, as described above with reference to FIGS. 2, 3, and 4, the LDPC decoding does not use correlations between neighboring bits. For this reason, in this embodiment, prior to the LDPC decoding, pieces of likelihood information of the continuous low-likelihood bits indicating signal correlations between neighboring bits are directly operated.

Figure 6:
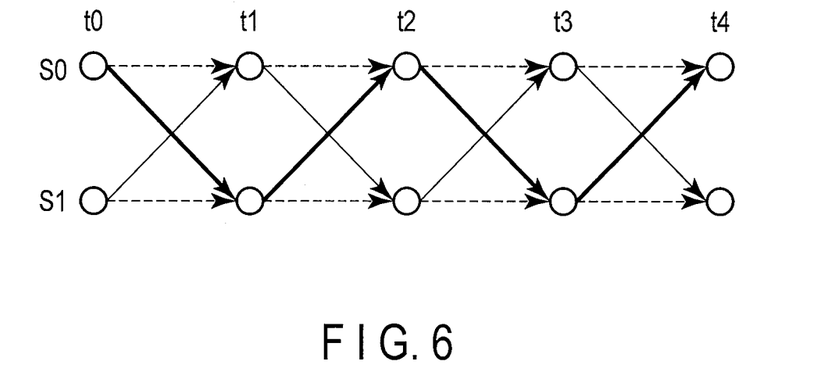
FIG. 6 is an exemplary view showing an example of a hard decision result of a Viterbi decoding of an SOVA decoder in the magnetic disk apparatus according to the embodiment.

FIG. 6 is a view for explaining a hard decision result in the SOVA decoder.

As described above, the LDPC decoding uses likelihood information output from the SOVA decoder. As described above with reference to FIG. 5, the polarities of pieces of likelihood information output from the SOVA decoder are often inverted like the polarities of pieces of likelihood information in the low likelihood information interval.

FIG. 6 will explain an example of the reason for polarity inversion. As a cause of polarity inversion, it is assumed that paths required to obtain hard decision results in the SOVA decoder are not merged.

Such cause will be described in detail below with reference to FIG. 6. S0 indicates a state of a bit "0". S1 indicates a state of a bit "1". t0 to t4 indicate state change times. For example, in case that a state of a path transits as indicated by the bold solid lines, an obtained result is "10101". On the other hand, in case that a state of a path transits as indicated by the solid lines, an obtained result is "01010". As for these two paths, the path indicated by the bold solid lines is called a selected path, and the path indicated by the solid lines is called a computed path. Using these two paths in SAM (Sequenced Amplitude Margin) or the like of the Viterbi algorithm, pieces of likelihood information (LLR values) shown in FIG. 5 are obtained. Higher likelihood information of the two pieces of obtained likelihood information is used as a hard decision result.

However, in case that states are not merged, and the paths alternately transit to states S0 and S1, as shown in FIG. 6, the obtained likelihood information exhibits low likelihood information. In case that pieces of likelihood information are obtained from such non-merging paths for a plurality of continuous bits, the polarities of pieces of likelihood information corresponding to neighboring bits may be inverted as in the low likelihood information interval such as the region 50 in FIG. 5.

Figure 7:
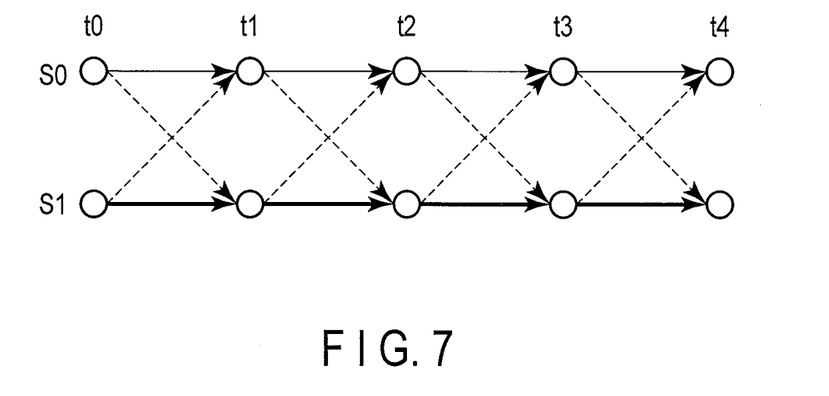
FIG. 7 is an exemplary view showing another example of a hard decision result of the Viterbi decoding of the SOVA decoder in the magnetic disk apparatus according to the embodiment.

FIG. 7 is a view for explaining a hard decision result in the SOVA decoder, and shows another example of the reason for polarity inversion. Note that a description of the same elements as in FIG. 6 will not be repeated.

In FIG. 7, a result obtained via the selected path is "00000". A result obtained via the computed path is "11111". In case that these two paths transit in identical states and are not merged, polarity of pieces of likelihood information corresponding to neighboring bits may be inversed, as in the two paths shown in FIG. 6.

The arrangement of a read signal processor of the R/W channel 12 shown in FIG. 1 will be described below with reference to FIG. 8.

The read signal processor includes a pre-amplifier 40, Automatic Gain Control (AGC) 41, asymmetry correcting circuit (ASYM) 42, Continuous Time Filter (CTF) 43 which is one of waveform equalizer, analog-to-digital converter (ADC) 44, Finite Impulse Response (FIR) filter 45, SOVA decoder 46, LDPC decoder 47, PLL 50, and the like.

The AGC 41 is connected to the asymmetry correcting circuit 42. The AGC 41 includes a Variable Gain Amplifier (VGA) 41a. An input signal amplified by the pre-amplifier 40 is input to the VGA 41a. An output result of the VGA 41a is supplied to the asymmetry correcting circuit 42.

The asymmetry correcting circuit 42 is connected to CTF 43. The asymmetry correcting circuit 42 corrects a vertical asymmetric distortion (asymmetry) of an input signal. A result of correcting by the asymmetry correcting circuit 42 is supplied to the CTF 43 as an output value.

The CTF 43 is connected to the ADC 44. The CTF 43 is a low-pass filter, and equalizes a waveform of a signal of the output result of the asymmetry correcting circuit 42. An output result of the CTF 43 is output to the ADC 44.

The ADC 44 is connected to the FIR filter 45 and PLL 50. The ADC 44 quantizes an analog signal, which is waveform-equalized by the CTF 43, using a phase sync signal generated by the PLL 50 to convert the analog signal into a digital signal. An output signal of the ADC 44 is supplied to the FIR filter 45.

The FIR filter 45 is connected to SOVA decoder 46. The FIR filter 45 performs waveform equalization to the digital output signal of the ADC 44. An output result of the FIR filter 45 is supplied to the SOVA decoder 46.

The SOVA decoder 46 is a soft decision Viterbi decoder, and is connected to a likelihood information change module 21. The SOVA decoder 46 performs decoding processing with regard to the output signal of the FIR filter 45, and supplies the decoding result to the likelihood information change module 21. Note that the decoding result includes likelihood information.

The LDPC decoder 47 is connected to the SOVA decoder 46. The LDPC decoder 47 executes processing for correcting errors of encoded data using the LDPC code based on changed likelihood information received from the likelihood information change module 21. Note that an arrow 51 indicates that the LDPC decoding result is fed back to the SOVA decoder 46. An arrow 52 indicates iterations of the LDPC decoding.

The Phase Locked Loop (PLL) 50 is connected to the ADC 44.

The likelihood information change module 21 operates and changes likelihood information received from the SOVA decoder 46. To operate and change the likelihood information is, for example, to change an LLR value shown in FIG. 5. The likelihood information change module 21 outputs the changed likelihood information to the LDPC decoder 47.

Note that a circuit for outputting likelihood information to the likelihood information change module 21 may be the FIR filter 45 in place of the SOVA decoder 46. Therefore, the likelihood information change module 21 may operate likelihood information output from the FIR filter 45.

Figure 9:
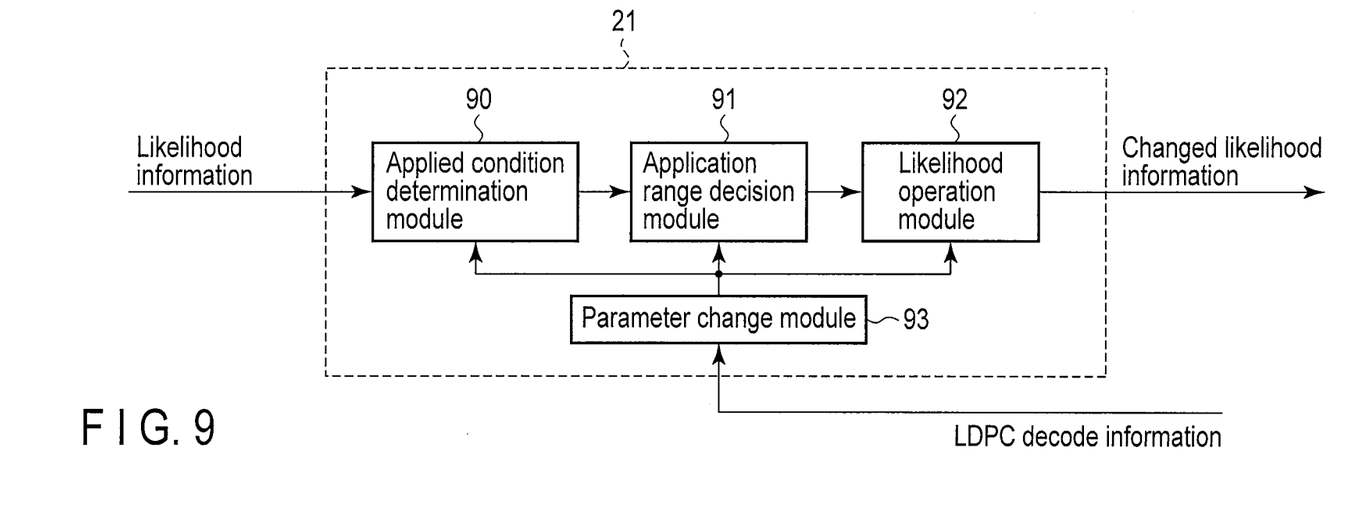
FIG. 9 is an exemplary block diagram showing an example of the configuration of a likelihood information change module in the magnetic disk apparatus according to the embodiment.

FIG. 9 is a block diagram showing the detailed configuration of the likelihood information change module 21.

The likelihood information change module 21 includes an application condition determination module 90, application interval decision module 91, likelihood operation module 92, and parameter change module 93.

The application condition determination module 90 is connected to the application interval decision module 91 and parameter change module 93. The application condition determination module 90 detects a detection interval which satisfies a likelihood information operation condition (to be referred to as an application condition hereinafter), based on likelihood information received from the SOVA decoder 46. The detection interval is the aforementioned low likelihood information interval or the like, as will be described in detail later.

An example of the application condition includes one of the following two conditions. The first condition is that as to whether or not a low likelihood information continuous interval of X1 bits or more in which absolute values of pieces of likelihood information are smaller than Y1 is detected. The second condition is condition that a low likelihood information continuous interval of X2 bits or more in which absolute values of pieces of likelihood information are smaller than Y2 and the polarity of the likelihood information is inverted for each bit, is detected. The X1, X2, Y1, and Y2 indicate parameters changed by the parameter change module 93. Note that the parameters will be described in detail later. Also, the X1, X2, Y1, and Y2 can be an arbitrary integer. Note that the X1 may be the X2 and the Y1 may be the Y2.

Note that the detected low likelihood information continuous interval is the interval which satisfies the application condition unlike the application interval in which the likelihood information is to be operated. "Interval" of the detected low likelihood information continuous interval, the detection interval, and the application interval is the interval corresponding to a plurality of continuous bits as in the region 50 shown in FIG. 5. However, "interval" may be interval corresponding to one bit. Also, likelihood information is, for example, an LLR value shown in FIG. 5.

Note that one encoded data may include a plurality of application intervals if the encoded data satisfies the aforementioned detection condition.

The application interval decision module 91 is connected to likelihood operation module 92 and the parameter change module 93. The application interval decision module 91 receives a result of the application condition determination module 90. The application interval decision module 91 decides the application interval in which the likelihood information is to be operated.

The application interval includes, for example, the following three intervals. The first application interval is the interval corresponding to the detection interval. The second application interval is the interval including the first application interval and an interval corresponding to Z bits which precede the first application interval. The third application interval is the interval including the first application interval and an interval corresponding to Z bits which follow the first application interval. The Z indicates a parameter changed by the parameter change module 93. Note that the parameter will be described in detail later. Also, the Z can be an arbitrary integer.

The preceding Z bits of the second application interval will be described in detail below. In FIG. 5, for example, if the detection interval is the interval corresponding to the 20th to 24th bits and Z bits are 3 bits, the interval corresponding to the preceding Z bits is the interval corresponding to the 17th to 19th bits. The following Z bits of the third application interval will be described in detail below. In FIG. 5, for example, if the detection interval is the interval corresponding to the 20th to 24th bits and Z bits are 3 bits, the interval corresponding to the following Z bits is the interval corresponding to the 25th to 27th bits.

The likelihood operation module 92 is connected to the parameter change module 93. The likelihood operation module 92 change items of the likelihood information corresponding to the application interval decided by the application interval decision module 91 by operating the items of the likelihood information. This change by the likelihood operation module 92 corresponds to the likelihood operation. The likelihood operation module 92 outputs the pieces of changed likelihood information to the LDPC decoder 47.

The likelihood operation by the likelihood operation module 92 includes, for example, the following four operations. The first likelihood operation raises (increases) the value of the likelihood information without inverting the polarity of the likelihood information (LLR). The second likelihood operation falls (decreases) a value of the likelihood information without inverting the polarity of the likelihood information. The third likelihood operation inverts the polarity of the likelihood information without changing the absolute value of the likelihood information. The fourth likelihood operation sets the value of the likelihood information to zero.

The parameter change module 93 is connected to the LDPC decoder 47. The parameter change module 93 changes parameters required to execute the likelihood operation based on LDPC decode information received from the LDPC decoder 47. The parameter change module 93 supplies information associated with the changed parameters to the application condition determination module 90, application interval decision module 91, and likelihood operation module 92. Note that the parameters include those associated with values X1, X2, Y, and the like in the application conditions, the parameter associated with a value Z in the application interval, the parameter associated with one of the first to fourth likelihood operations to be selected, and the like.

The LDPC decode information is obtained before execution of the LDPC decoding in the LDPC decoder 47. The LDPC decode information is associated with a state of the LDPC decoder 47, e.g., associated with the number of codes of errors in parity check for checking how many errors the encoded data includes. The number of codes of errors includes indices indicating the LDPC decoding performance (for example, indices such as a syndrome weight, SER (Sector Error Rate, and the like)). Whether or not the LDPC decoding performance is improved can be determined based on the indices indicating the LDPC decoding performance.

Figure 10:
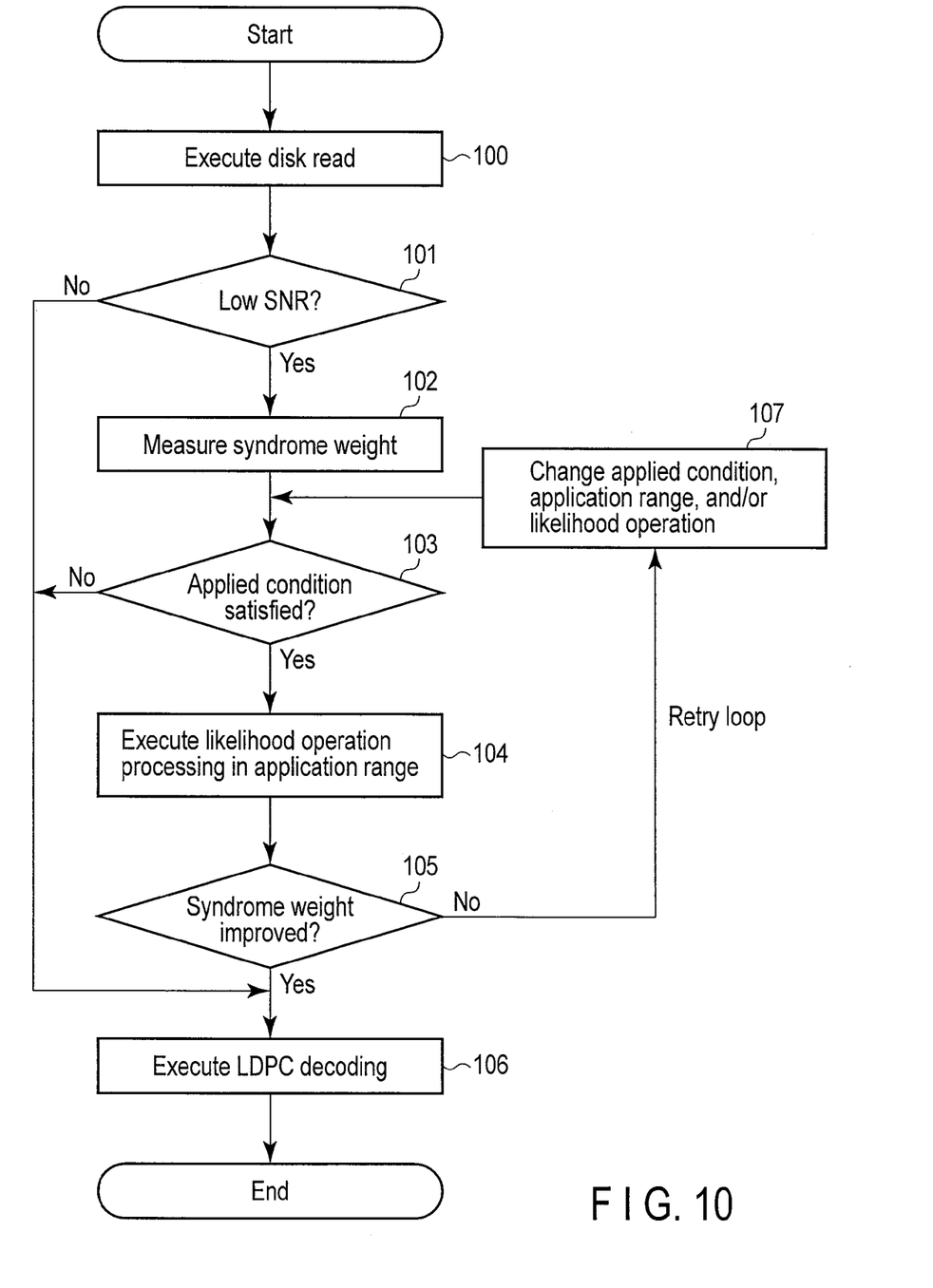
FIG. 10 is an exemplary flowchart showing the likelihood operation processing sequence according to the embodiment.

The processing sequence associated with the likelihood operation will be described below with reference to FIG. 10.

In block 100, the magnetic disk apparatus executes processing to read data from the magnetic disk 1. It is determined in block 101 whether or not a Signal Noise Ratio (SNR) measured by the MPU 14 or the like is lower than a predetermined value. If the SNR is higher than the predetermined value, the LDPC decoding is executed in block 106. If the SNR is lower than the predetermined value, it is determined that it is difficult to correct errors of the encoded data 23 by only so-called normal the LDPC decoding without any likelihood operation of this embodiment (for example, the LDPC decoding by the SOVA decoder 46 and the LDPC decoder 47), and the process advances to block 102 as the sequence for starting the likelihood operation of this embodiment.

In block 102, the LDPC decoder 47 or the like measures the syndrome weight. The application condition determination module 90 checks in block 103 whether or not the encoded data 23 supplied by the FIR filter 45 or the SOVA 46 satisfies the application condition. As the application condition, one of the first and second application conditions is set. If the encoded data 23 does not satisfy the application condition, it is determined that the LDPC decoding characteristics cannot be improved even by the likelihood operation, and the LDPC decoding is executed in block 106. If the encoded data 23 satisfies the application condition, it is determined that the LDPC decoding characteristics can be improved by executing the likelihood operation, and the process advances to block 104.

In block 104, the likelihood operation module 92 executes the likelihood operation with regard to the aforementioned application interval. As the application interval (range), one of the first to third intervals is set. As the likelihood operation, one of the first to fourth operations is set. In block 105, the LDPC decoder 47 measures the syndrome weight based on the likelihood information changed by the likelihood operation. The measured syndrome weight is compared with the syndrome weight measured in block 102. The syndrome weight is one of indices required to determine whether or not the LDPC decoding characteristics are improved. By comparing the syndrome weight values, for example, if the syndrome weight value has been changed to a value indicating that the LDPC decoding characteristics are improved, the LDPC decoding is executed based on the changed likelihood information in block 106.

As a result of comparison of the syndrome weight values in block 105, if the syndrome weight value has not been changed to a value indicating that the LDPC decoding characteristics are improved (more specifically, if the aforementioned number of codes of errors in the parity check is not decreased), the control enters a retry loop required to execute the likelihood operation again.

In block 107, the application condition, application interval, and/or likelihood operation are/is changed so as to retry the likelihood operation. The application condition, application interval (range), and/or likelihood operation are/is changed by changing the parameters of the application condition, application interval, and/or likelihood operation by the parameter change module 93. The likelihood operation is executed based on the changed application condition, application interval, and/or likelihood operation.

Note that execution of the LDPC decoding in block 106 corresponds to decoding processing executed after the syndrome weight is measured. The LDPC decoding in block 106 includes iterative decoding or the like which is iteratively executed in the LDPC decoding. That is, a time required for the LDPC decoding in block 106 is longer than a time required for measuring the syndrome weight.

As described above, according to this embodiment, the LDPC decoding performance can be improved by changing the likelihood information. The interval of the likelihood information to be operated includes pieces of continuous low likelihood information of pieces of likelihood information. By operating the pieces of continuous low likelihood information, index indicating the LDPC decoding performance (for example, a syndrome weight or SER (Sector Error Rate)) can be improved. Likelihood information can be obtained for each bit of the encoded data having a plurality of bits. For this reason, by selecting pieces of continuous low likelihood information as operation targets, the index can be effectively improved compared to an operation of likelihood information even in a case in which likelihood information corresponding to one bit is low. The low likelihood information has a value close to zero. Therefore, by operating likelihood information which is more likely to influence the index, the index can be effective improved. Also, the likelihood information is obtained as a result of decoding having signal correlations between neighboring bits of encoded data by the soft decision Viterbi decoder 46 before execution of the LDPC decoding. For this reason, by operating likelihood information obtained by decoding having signal correlations before execution of the LDPC decoding without any signal correlation, the LDPC decoding characteristics can be improved. Also, by changing a detection condition of an interval as an operation target of likelihood information, the interval as the operation target of likelihood information, and/or operation contents of likelihood information, the LDPC decoding performance can be effectively improved.

Though the embodiment is explained as the magnetic disk apparatus, the embodiment may be applied to a nonvolatile memory drive apparatus, a hybrid storage apparatus using a magnetic disk and nonvolatile memory.

Figure 8:
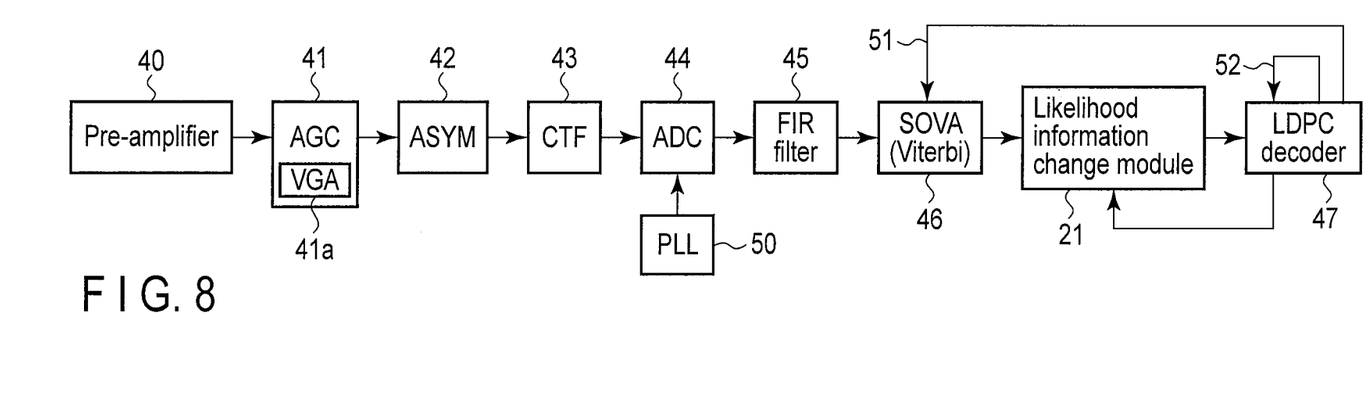
FIG. 8 is an exemplary block diagram showing an example of the configuration of a read processor in the magnetic disk apparatus according to the embodiment.

Also, the functions of the respective units shown in FIGS. 8 and 9 may be implemented by, for example, hardware components such as a dedicated LSI and DSP.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A decoding apparatus comprising:
a Viterbi decoder configured to receive encoded data, decode the received encoded data, and output a likelihood information being a decoding result;
a change module configured to receive the likelihood information from the Viterbi decoder, change the likelihood information when values of the likelihood information for a first period of time are smaller than a first value, and output the received likelihood information or the changed likelihood information; and
a low density parity check decoder configured to decode the output of the change module.

2. The apparatus of claim 1, wherein
the encoded data comprises bits, and
the Viterbi decoder is configured to output the likelihood information having signal correlations between neighboring bits.

3. The apparatus of claim 1, wherein
the change module is configured to change the value of the likelihood information by executing one of operations, and
wherein the operations comprise a first operation configured to increase the value of the likelihood information, a second operation configured to decrease the value of the likelihood information, a third operation configured to invert a polarity of the likelihood information, and a fourth operation configured to set the value of the likelihood information to zero.

4. The apparatus of claim 1, wherein
the encoded data comprises bits, and
the Viterbi decoder is configured to output the likelihood information for each of the bits of the encoded data,
the apparatus further comprises a detection module configured to detect an interval of the encoded data in which absolute values of the likelihood information are smaller than the first value, and
the change module is further configured to change values of the likelihood information in the detected interval.

5. The apparatus of claim 4, wherein the change module is configured to change the values of the likelihood information in the detected interval and in an interval which precedes or follows the detected interval.

6. The apparatus of claim 1, wherein
the encoded data comprises bits, and
the Viterbi decoder is configured to output the likelihood information for each of the bits of the encoded data,
the apparatus further comprises a detection module configured to detect an interval of the likelihood information having (i) a continuous sequence of bits more than a first number of bits, (ii) absolute values of the likelihood information being smaller than the first value, and (iii) polarities of the likelihood information being inverted, and
the change module is configured to change values of the likelihood information in the detected interval.

7. The apparatus of claim 6, wherein the change module is configured to change the values of the likelihood information in the detected interval and in an interval which precedes or follows the detected interval.

8. The apparatus of claim 1, further comprising a determination module configured to determine based on an index measured using the output from the change module whether performance of the low density parity check decoder is improved, the index comprising a syndrome weight or a sector error rate, and wherein the low density parity check decoder is configured to decode the output of the change module when the determination module determines the performance of the low density parity check decoder is improved.

9. A decoding method comprising:
receiving encoded data;
decoding the received encoded data;
outputting a likelihood information being a decoding;
changing the outputted likelihood information when values of the likelihood information for a first period of time are smaller than a first value; and
decoding the outputted likelihood information or the changed likelihood information.

10. The method of claim 9, wherein
the encoded data comprises bits, and
the likelihood information comprises signal correlations between neighboring bits by executing Viterbi decoding.

11. The method of claim 9, wherein
the changing comprises changing the value of the likelihood information by executing one of operations, and
wherein the operations comprise a first operation configured to increase the value of the likelihood information, a second operation configured to decrease the value of the likelihood information, a third operation configured to invert a polarity of the likelihood information, and a fourth operation configured to set the value of the likelihood information to zero.

12. The method of claim 9, wherein
the encoded data comprises bits, and
the likelihood information is output for each of the bits of the encoded data,
the method further comprises detecting an interval of the encoded data in which absolute values of the likelihood information are smaller than the first value, and
the changing comprises changing values of the likelihood information in the detected interval.

13. The method of claim 9, wherein
the encoded data comprises bits, and
the likelihood information is output for each of the bits of the encoded data,
the method further comprises detecting an interval of the likelihood information having (i) a continuous sequence of bits more than a first number of bits, (ii) absolute values of the likelihood information being smaller than the first value, and (iii) polarities of the likelihood information being inverted, and
the changing comprises changing values of the likelihood information in the detected interval.

14. The method of claim 9, further comprising determining based on an index measured using the outputted likelihood information whether performance of decoding the outputted likelihood information or the changed likelihood information is improved, the index comprising a syndrome weight or a sector error rate, and wherein the decoding comprises decoding the outputted likelihood information or the changed likelihood information when it is determined that the performance is improved.

15. A storage apparatus comprising:
a storage module configured to store encoded data; and
a Viterbi decoder configured to receive the encoded data from the storage module, decode the received encoded data, and output a likelihood information being a decoding result;
a change module configured to receive the likelihood information from the Viterbi decoder, change the likelihood information when values of the likelihood information for a first period of time are smaller than a first value, and output the received likelihood information or the changed likelihood information; and
a low density parity check decoder configured to decode the output of the change module.

16. The apparatus of claim 15, wherein
the encoded data comprises bits, and
the Viterbi decoder is configured to output the likelihood information having signal correlations between neighboring bits.

17. The apparatus of claim 15, wherein
the change module is configured to change the value of the likelihood information by executing one of operations, and
wherein the operations comprise a first operation configured to increase the value of the likelihood information, a second operation configured to decrease the value of the likelihood information, a third operation configured to invert a polarity of the likelihood information, and a fourth operation configured to set the value of the likelihood information to zero.

18. The storage apparatus of claim 15, wherein
the encoded data comprises bits, and
the Viterbi decoder is configured to output the likelihood information for each of the bits of the encoded data,
the apparatus further comprises a detection module configured to detect an interval of the encoded data in which absolute values of the likelihood information are smaller than the first value, and
the change module is configured to change values of the likelihood information in the detected interval.

19. The storage apparatus of claim 15, wherein
the encoded data comprises bits, and
the Viterbi decoder is configured to output the likelihood information for each of the bits of the encoded data,
the apparatus further comprises a detection module configured to detect an interval of the likelihood information having (i) a continuous sequence of bits more than a first predetermined number of bits, (ii) absolute values of the likelihood information being smaller than the first value, and (iii) polarities of the likelihood information being inverted, and
the change module is configured to change values of the likelihood information in the detected interval.

20. The apparatus of claim 15, further comprising a determination module configured to determine based on an index measured using the output from the change module whether performance of the low density parity check decoder is improved, the index comprising a syndrome weight or a sector error rate, and wherein the low density parity check decoder is configured to decode the output of the Viterbi decoder when the determination module determines the performance of the low density parity check decoder is improved.

* * * * *